(12) United States Patent
Oberlaender

(10) Patent No.: US 7,437,692 B2
(45) Date of Patent: Oct. 14, 2008

(54) MEMORY DEBUGGER FOR SYSTEM-ON-A-CHIP DESIGNS

(75) Inventor: Klaus J. Oberlaender, San Jose, CA (US)

(73) Assignee: Infineon Technologies AG, Neubiberg (DE)

( * ) Notice: Subject to any disclaimer, the term of this patent is extended or adjusted under 35 U.S.C. 154(b) by 1071 days.

(21) Appl. No.: 10/705,101

(22) Filed: Nov. 10, 2003

(65) Prior Publication Data
US 2005/0102572 A1 May 12, 2005

(51) Int. Cl.
*G06F 17/50* (2006.01)

(52) U.S. Cl. .................. 716/4; 716/1; 716/18; 716/19; 703/14

(58) Field of Classification Search ............. 716/1, 716/4, 18, 19
See application file for complete search history.

(56) References Cited

U.S. PATENT DOCUMENTS 6,658,519 B1 * 12/2003 Broberg et al. .............. 710/311

* cited by examiner

*Primary Examiner*—Thuan Do
(74) *Attorney, Agent, or Firm*—Dickstein Shapiro LLP

(57) ABSTRACT

A simulation/debugging method for SOC designs that utilizes initial memory values loaded into a simulation model. A test program is then executed, and incremetal transaction records are generated for each incremental memory access (e.g., data write operations). Each transaction record includes a timestamp, address and data values. The transaction record information is stored/captured on a high level-based (i.e., system address-based) domain that takes into account all the tiling, interleaving, scrambling, and unaligned accessing used in the simulated SOC design, rather than on a low level-based (i.e., physical memory address-based) domain. Upon completing the simulation, the instantaneous memory contents at any selected point in time during the simulated execution are calculated by combining the initial data and intermediate transaction record information. Automatic memory dump and sanity check tests verify the integrity of the final data value and incremental transactions. Cache memory information is collected and displayed using a system-level format.

28 Claims, 5 Drawing Sheets

| | 0F | 0E | 0D | 0C | 0B | 0A | 09 | 08 | 07 | 06 | 05 | 04 | 03 | 02 | 01 | 00 |
|---|---|---|---|---|---|---|---|---|---|---|---|---|---|---|---|---|
| 01AF-01A0 | D8 | DD | 0A | 0A | BC | BC | AF | AF | 0B | 00 | 0A | 0A | 8C | 8C | AF | AF |
| 019F-0190 | D8 | DD | 0A | 0A | BC | BC | AF | AF | 0B | 00 | 0A | 0A | 8C | 8C | AF | AF |
| 018F-0180 | D8 | DD | 0A | 0A | BC | BC | AF | AF | 0B | 00 | 0A | 0A | 8C | 8C | AF | AF |
| 017F-0170 | D8 | DD | 0A | 0A | BC | BC | AF | AF | 0B | 00 | 0A | 0A | 8C | 8C | AF | AF |
| 016F-0160 | D8 | DD | 0A | 0A | BC | BC | AF | AF | 0B | 00 | 0A | 0A | 8C | 8C | AF | AF |
| 015F-0150 | D8 | DD | 0A | 0A | BC | BC | AF | AF | 0B | 00 | 0A | 0A | 8C | 8C | AF | AF |
| 014F-0140 | D8 | DD | 0A | 0A | BC | BC | AF | AF | 0B | 00 | 0A | 0A | 8C | 8C | AF | AF |
| 013F-0130 | D8 | DD | 0A | 0A | BC | BC | AF | AF | 0B | 00 | 0A | 0A | 8C | 8C | AF | AF |
| 012F-0120 | D8 | DD | 0A | 0A | BC | BC | AF | AF | 0B | 00 | 0A | 0A | 8C | 8C | AF | AF |
| 011F-0110 | D8 | DD | 0A | 0A | BC | BC | AF | AF | 0B | 00 | 0A | 0A | 8C | 8C | AF | AF |
| 010F-0100 | D8 | DD | 0A | 0A | BC | BC | AF | AF | 0B | 00 | 0A | 0A | 8C | 8C | AF | AF |
| 00FF-00F0 | D8 | DD | 0A | 0A | BC | BC | AF | AF | 0B | 00 | 0A | 0A | 8C | 8C | AF | AF |
| 00EF-00E0 | D8 | DD | 0A | 0A | BC | BC | AF | AF | 0B | 00 | 0A | 0A | 8C | 8C | AF | AF |
| 00DF-00D0 | D8 | DD | 0A | 0A | BC | BC | AF | AF | 0B | 00 | 0A | 0A | 8C | 8C | AF | AF |
| 00CF-00C0 | D8 | DD | 0A | 0A | BC | BC | AF | AF | 0B | 00 | 0A | 0A | 8C | 8C | AF | AF |
| 00BF-00B0 | D8 | DD | 0A | 0A | BC | BC | AF | AF | 0B | 00 | 0A | 0A | 8C | 8C | AF | AF |
| 00AF-00A0 | D8 | DD | 0A | 0A | BC | BC | AF | AF | 0B | 00 | 0A | 0A | 8C | 8C | AF | AF |
| 009F-0090 | D8 | DD | 0A | 0A | BC | BC | AF | AF | 0B | 00 | 0A | 0A | 8C | 8C | AF | AF |
| 008F-0080 | D8 | DD | 0A | 0A | BC | BC | AF | AF | 0B | 00 | 0A | 0A | 8C | 8C | AF | AF |
| 007F-0070 | D8 | DD | 0A | 0A | BC | BC | AF | AF | 0B | 00 | 0A | 0A | 8C | 8C | AF | AF |
| 006F-0060 | D8 | DD | 0A | 0A | BC | BC | AF | AF | 0B | 00 | 0A | 0A | 8C | BC | AF | AF |
| 005F-0050 | D8 | DD | 0A | 0A | BC | BC | AF | AF | 0B | 00 | 0A | 0A | 8C | BC | AF | AF |
| 004F-0040 | D8 | DD | 0A | 0A | BC | BC | AF | AF | 0B | 00 | 0A | 0A | BC | BC | AF | AF |
| 003F-0030 | 00 | 00 | 0A | 0A | BC | BC | AF | AF | 00 | 00 | ED | EA | D0 | 91 | FD | EA |
| 002F-0020 | D0 | 91 | F0 | D0 | EC | 91 | 01 | DC | 10 | 3C | 11 | 09 | 1D | 1C | 00 | 91 |
| 001F-0010 | D8 | DD | 0A | 0A | BC | BC | AF | AF | XX | XX | XX | XX | XX | 8C | XX | XX |
| 000F-0000 | XX | XX | XX | XX | XX | XX | XX | XX | XX | XX | XX | XX | XX | 8C | 10 | 3C |

Transactions

| Time | Address | Type | Width | Data |
|---|---|---|---|---|
| 015000 | D4000000 | RD | 64 | XXXXXXXXXXXX103C |
| 017000 | D4000008 | WR | 64 | XXXXXXXXXXXXXXXX |
| 019000 | D4000010 | RD | 64 | XXXXXXXXXXXXXXXX |
| 021000 | D4000020 | WR | 64 | 103C11D91D400091 |
| 023000 | D4000028 | RD | 64 | D091F000F09101DC |
| 025000 | D4000030 | WR | 64 | 0000EDEAD091FDEA |
| 027000 | D4000038 | RD | 64 | 0000000000000000 |

FIG. 7

MEMORY DEBUGGER FOR SYSTEM-ON-A-CHIP DESIGNS

FIELD OF THE INVENTION

The present invention relates generally to testing circuit designs by software simulation, and more particularly to a method for debugging system-on-a-chip (SOC) designs incorporating embedded processors.

BACKGROUND OF THE INVENTION

Modern integrated circuit (IC) devices are substantially more complex and sophisticated than early IC designs. Early IC chip designs typically embodied relatively simple electronic logic blocks formed by interconnections between logic gates. In contrast, modern IC chips often include combinations of memory and application-specific integrated circuit (ASIC) components surrounding an embedded processor (often called a "central processing unit (CPU) core"), which together constitute an entire "system-on-a-chip" (SOC) device. Exemplary SOC devices are designed and produced using architectural tools and libraries associated with the TriCore™ family of processor devices, which is the property of Infineon Technologies AG of Munich, Germany.

The development of SOC IC device (as well as less sophisticated ASIC devices) includes a design phase, which includes simulating and verifying a circuit design using a high-level (e.g., Register Transfer Level (RTL)) hardware description language, a place, route and layout phase for determining the physical arrangement of the components and wiring associated with the verified circuit design, and forming the physical circuit layout that is fabricated onto a semiconductor wafer. The design phase typically involves selecting and defining a high-level software model of the circuit design that may include various predefined model components (e.g., CPU core, data and program memory circuits, cache memory, etc.) from a design library using software tools available from the SOC/ASIC provider (e.g., Infineon Technologies AG). A device simulator tool ("simulator") is then used to test the circuit design model by simulating the execution of selected test programs. The results of these simulations are used to verify that the circuit design model will function as intended, or used to debug and correct errors in the circuit design model. This simulation and verification process has been increasingly relied on by SOC device manufacturers to reduce time-to-market delays, and to avoid prototyping costs. Once the circuit designer is sufficiently confident that the SOC design is accurate, the SOC design proceeds to the place/route/layout and fabrication stages of production.

While the use of simulators to verify and debug circuit designs greatly decreases manufacturing costs by minimizing costly design flaws prior to fabrication, there are several practical problems that limit the use of simulators to achieve acceptably bug-free SOC designs. In particular, in order to verify that a SOC design is substantially bug-free, the execution of a sufficient number of test programs must be simulated to adequately exercise the design. One practical problem associated with the verification of SOC designs is the magnitude of information being processed and stored during these multiple simulations. Another problem is that modern SOC designs often have several hundred thousand to millions of memory cells associated with the embedded processor, and identifying errors in the reading (loading) and writing (storing) of data to/from these memory cells makes analyzing and debugging SOC designs using the simulation results extremely time consuming and complex. This problem is mainly produced by the fact that the data in the memory cells typically has a long history (i.e., is repeatedly updated over the course of the test program), in contrast to the processor core (a.k.a., the CPU pipeline), which normally only has a sequential history as deep as the pipeline itself. The long history associated with memory cells creates problems during the debugging process (i.e., analyzing the simulation results when bugs are detected) because the task of tracking the contents of thousands of memory cells over thousands of lines of code, and then presenting the memory contents in a meaningful fashion greatly challenges the capacity of modern computers, and, even more importantly, the designer's ability to read, check and verify the vast amounts of simulation data generated by the computer.

The complexity associated with verifying SOC designs is further complicated in view of the fact that, in a DSP architecture such as that found in TriCore-based SOC devices, the memory system does not just consist of one single 2-dimensional memory array that can be traced and viewed, but rather consists of multiple memory arrays that contain data tiled in both directions, and sometimes even scrambled and interleaved. This tiling, scrambling and interleaving is used to achieve optimal timing and floorplanning results in a physical-level data accessing domain, but certainly increases the need for debugging due to its higher architectural complexity (and therefore increases the chance of bugs), and also due to reduced observability. Tiling is also used to access several of these memories with different address rows so that accesses spanning one physical line become possible. TriCore supports such unaligned accesses. Also TriCore allows different widths of the data objects accessed. To save power only those memory elements that are needed for an access of a certain width can then be activated, which could not be supported by one single (wide) memory. Further complexity arises when additional write first-in first-out (fifo) memories are used between the CPU and the memory system that complicate the memory system's debug process.

Conventional debugging of SOC designs is typically focused on the physical memory cells of the SOC's memory arrays, and typically display physical-level memory information using waveform viewers. A problem with this arrangement is that, to debug memory systems in such SOC designs, a circuit designer would have to look at the contents of several thousand memory cells and/or interfaces of several memories and write buffers to determine the exact memory content, and would have to observe the waveforms bit by bit, and simulation step after simulations step, to determine which macro-transactions are occurring, how wide the transactions are, and which memories the transactions involve.

Another conventional debugging approach reads and stores the entire contents of the SOC memory after each transaction (e.g., write operation). A problem with this approach is that it is very time consuming to read and store every memory location during a simulation including thousands of regression tests, each regression test including thousands of transactions. In addition, modern SOC designs typically include memories storing thousands of bytes of information. Therefore, another problem arises with respect to the capacity of a workstation for storing the entire memory contents over thousands of transactions and thousands of test programs, which can become overwhelmed with the large amount of data. A final problem is the practical issue of processing the large amount of data generated by this method.

What is needed is a more effective method for simulating and debugging SOC designs that avoids the capacity problems associated with conventional debugging/simulation techniques, while providing high-level views of memory activity during operation, and automatically self-checking portions of the data that can be automatically checked.

SUMMARY OF THE INVENTION

The present invention is directed to a transaction-based method for simulating/debugging SOC designs that utilizes initial memory values and incremetal transaction records to chronicle memory contents during simulation of the SOC design, thereby avoiding the capacity and complexity problems associated with conventional debugging techniques, and providing a substantially faster and more reliable debugging process that minimizes data storage requirements. The method begins by loading a set of initial data values into the memory circuit of a simulated SOC design (i.e., the simulation model). Simulated execution of a test program by the simulation model is then performed using known techniques. To chronical memory changes (e.g., data write operations), address and data signals transferred to memory interfaces associated with the simulated model are utilized to form incremetal transaction records. Each transaction record includes a timestamp value indicating when the transaction occured, address information identifying the memory cells changed during the transaction, and the actual data written to these memory cells. In one embodiment, the data contained in each transaction record is compressed in a manner that saves diskspace and simulation time, but facilitates easy text based debug techniques and additional checks after the simulation is completed. Accordingly, the memory contents at any selected point in time during the simulated execution can be visually displayed for debugging purposes using a dedicated GUI by combining the initial data values and relevent transaction records having timestamp values between the start of the simulation and the selected point in time in the simulated execution. For example, to determine the memory contents at a memory location D0 at a simulation time t1, the initial memory content of location D0 is sequentially modified to incorporate each transaction record generated between time t0 (i.e., the start of the simulation) and time t1 that includes data written to location D0. Accordingly, the present invention facilitates debugging of the SOC design using substantially less storage capacity by providing a method for reconstructing the memory contents at each point in time of the simulation using the initial data and transaction records that only contain incremental data changes associated with the corresponding transaction (i.e., as opposed to the entire memory contents).

According to an aspect of the present invention, both the initial data written into the simulated memory and the transaction records are stored/captured on a high level-based (i.e., system address-based) domain, rather than on a low level-based (i.e., physical memory address-based) domain. That is, the high level-based transaction data does not include the data content and changes associated with each physical memory location, but rather facilitates a user-friendly debug process by reassembling these physical transactions back into system-level transactions. This approach requires less storage space, in addition to be easier to read, in that the transactions of multiple physical memories are combined into one transaction record if they belong to the same logical/system memory. In one embodiment, initial data values are converted from a system-level form into a physical level form before writing into the memory array associated with the simulation model. Similarly, transaction records are generated by probing the address, data and control signals of several physical memory cells and write fifo's, reassembling this information into system-level memory information that take into account all the tiling, interleaving and scrambling performed in the physical domain, and then forming transaction records using this reconstructed system-level memory information. By storing the initial data and transaction records in the system-level format, chronological changes to the memory content are readily presented to a designer (user) in a substantially more convenient manner than is possible when presented in a physical-level format. This system-level format is particularly beneficial in the presentation of cache memory contents.

According to another aspect of the present invention, an automatic test generates a final memory image from the initial data values and the transaction records, and cross-checks this final memory image with known good memory data. In one embodiment, a signature (i.e., compressed representation) of the final memory image is generated to minimize storage and analysis requirements.

According to yet another aspect of the present invention, a second automatic test (herein referred to as a "sanity check") is used to detect possible memory system or test malfunctions that would otherwise not necessarily be detected, or would take significant time to detect. In one embodiment, in addition to the transaction records generated for each write operation of the test program, transaction records are also generated for each read operation in which memory values are read from the memory for data processing purposes. The read operation transaction records are compared with the instantaneous data generated from the initial data and write data transaction records, thereby verifying that the data read from each memory location was not erroneously changed due to a bug or other hardware malfunction.

BRIEF DESCRIPTION OF THE DRAWINGS

These and other features, aspects and advantages of the present invention will become better understood with regard to the following description, appended claims, and accompanying drawings, where:

FIG. 7 is a simplified screenshot depicting a memory debugger general user interface (GUI) according to another embodiment of the present invention;

DETAILED DESCRIPTION OF THE DRAWINGS

Figure 1:
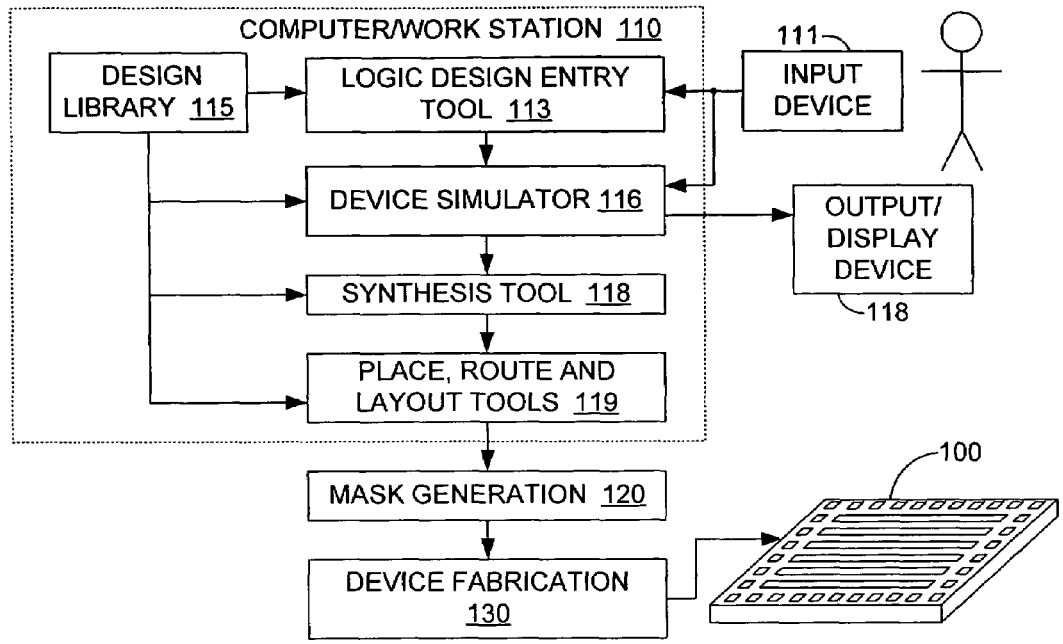
FIG. 1 is a flow diagram illustrating a simplified process for designing and fabricating an SOC integrated circuit device utilizing a device simulator according to the present invention.

FIG. 1 is a flow diagram illustrating a simplified process for designing and fabricating an SOC integrated circuit device 100 in the manner similar to that described above in the background section of this paper. During the design phase, a circuit designer typically enters a SOC design into a computer or workstation 110 using an input device 111. Workstation 110 is loaded with a logic design entry software tool 113 that is linked to a design library 115, which typically includes pre-defined circuit components (often referred to as "macros"). The circuit designer typically defines an SOC circuit design by forming a functionally representative software model (behavioral description) using a high level RTL hardware description language (e.g., VHDL or Verilog) that may utilize the readily available macros provided in design library 115. Once the SOC circuit design model is entered, a device simulator tool 116 is then used to test the circuit model by simulating the execution of selected test programs in the manner described below. The results of these simulation tests are used to verify that the high-level model will function as intended. In this manner, the circuit designer is able to debug the SOC design. After the verification process is completed, a synthesis tool 118 is then utilized to convert the high-level circuit model into a lower-level description including actual components (e.g., gates) and a netlist defining the various connections between the actual components. Equivalency checking is typically performed to verify that this lower-level description accurately reflects the verified high-level model. After the circuit designer is sufficiently confident that the SOC design is accurate, the lower-level SOC design is passed to place, route and layout tools 119, which are used to generate a place-and-route solution (i.e., arrange the various interrelated components of the SOC design in an efficient two-dimensional spatial relationship that can be fabricated on a chip, and generates interconnect lines for passing signals between the interrelated portions), and then to construct a three-dimensional representation of the actual circuit structures (e.g., regions of doped semiconductor, insulated regions, and metal lines) needed to implement the SOC design. This three-dimensional representation is then used to generate a set of two-dimensional masks (indicated by block 120) that are then used to fabricate successive layers of SOC integrated circuit device 100 (block 130) using known techniques.

Figure 2:
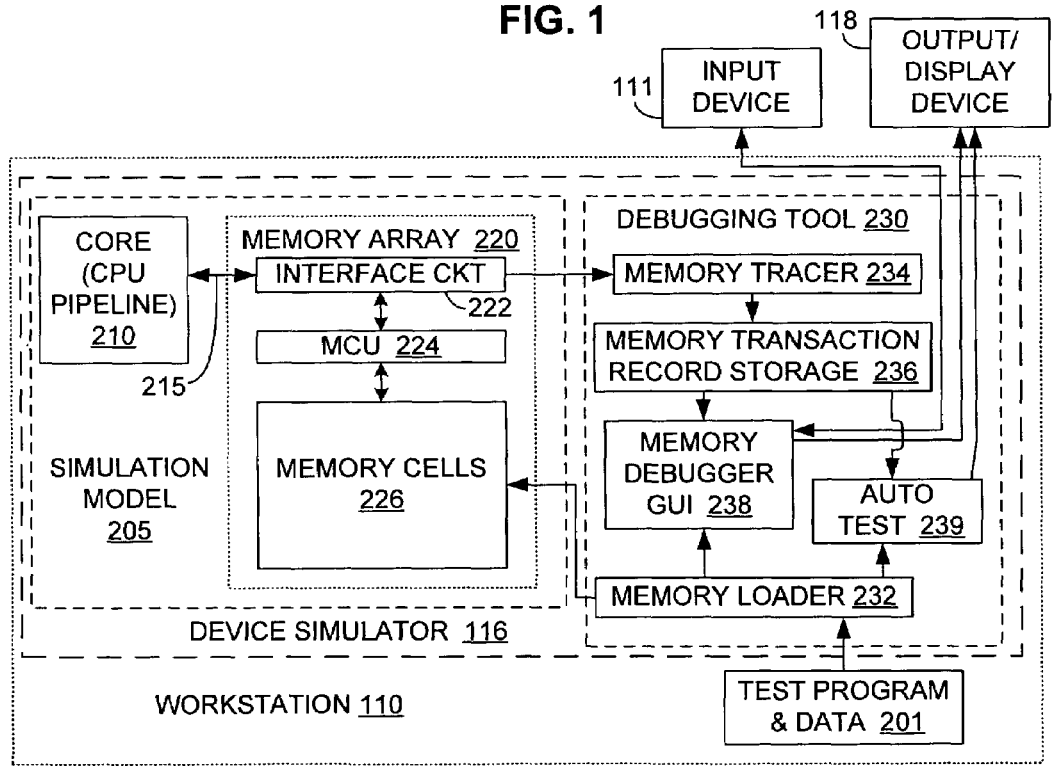
FIG. 2 is a simplified block diagram depicting workstation memory contents during the verification phase of the design/fabrication process shown in FIG. 1.

FIG. 2 is a simplified block diagram depicting a portion of the operating memory contents of workstation 110 during the verification phase of the design/fabrication process shown in FIG. 1 (i.e., during the operation of device simulator 116). As indicated in FIG. 2, device simulator 116 receives the design circuit model and initial data values from a test program and data file 201. Device simulator 116 includes a simulation model 205 that is formed during the design phase described above, and models the operation of SOC device 100. Device simulator 116 also includes a debugging tool 230 that operates according to the present invention in the manner described below. Other known components of device simulator 116 are omitted for brevity.

Referring to the left side of FIG. 2, according to the present example, simulation model 205 includes a processor core (CPU pipeline) 210 and a memory array 220 that are coupled by a system bus 215. CPU pipeline 210 processes program instructions associated with the test program read from test program and data file 201, which in one embodiment is stored in memory array 220. In the present example, data values processed in accordance with the program instructions are also stored in memory array 220 (in some embodiments, separate program and data memory devices may be used). In addition, memory array 220 includes an interface circuit 222 that communicates with CPU pipeline 210 over system bus 215, an array of memory cells 226, and a memory control unit (MCU) 224 coupled between interface circuit 222 and memory cells 226. Those skilled in the SOC art will recognize that simulation model 205 is greatly simplified, and that SOC devices typically include numerous circuit components and memory devices.

Referring now to the right side of FIG. 2, debugger tool 230 includes several sub-tools that are utilized to various functions of the debugging process, and are described in detail below. In the present embodiment, debugger tool 230 is separated into a memory loader tool 232, a memory tracer tool 234, a memory transaction record storage region 236, a memory debugger GUI 238, and one or more automatic memory test (AUTO TEST) tools 239. The functions performed by these various sub-tools are described in detail below.

Figure 3:
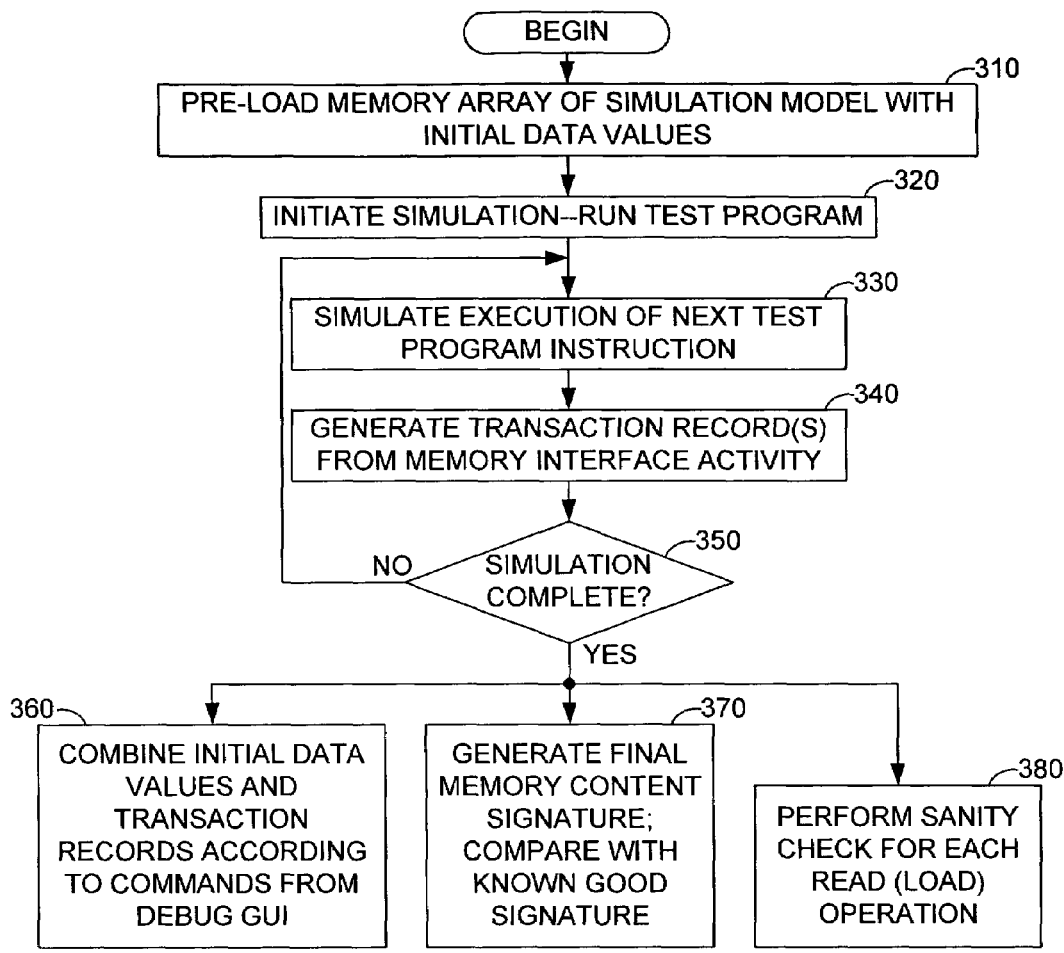
FIG. 3 is a flow diagram illustrating a simplified simulation/debugging method according to an embodiment of the present invention.

FIG. 3 is a flow diagram illustrating a simplified simulation/debugging process performed by device simulator 116 (FIG. 2) according to an embodiment of the present invention. Briefly stated, device simulator 116 simulates the SOC design modeled by simulation model 205 utilizing initial memory values provided by test program and data file 201, and creates incremetal transaction records generated by memory tracer 234 that are subsequently used during a transaction-based debugging process to chronicle (record) the contents of memory array 220 during simulated execution of the test program. The method begins by loading initial data values into memory array 220 (block 310). In one embodiment, the initial data values are pre-loaded using memory loader 232 in the manner described below. Simulated execution of a test program by simulation model 215 using known techniques is then initiated (block 320) and simulated execution of program instructions is performed (block 330). To chronical simulated accesses to memory array 220 (e.g., simulated data write operations), address and data signals transferred to interface circuit 222 are captured by memory tracer 234, which then generates incremetal transaction records that are stored in transaction record storage region 236 (block 340). As described in additional detail below, each transaction record includes a timestamp value indicating when the transaction occured, address information identifying, for example, the memory cells changed during a write operation, the actual data written to these memory cells, and, an optional data field indicating an access width (i.e., amount of the accessed/written data). This process is repeated for each program instruction of the test program until the simulation is completed (YES in block 350). Subsequently, memory debugger GUI 238 performs a transaction-based, user controlled debugging process by combining the initial data values, which are passed from memory loader 232 to memory array 220, with the transaction records stored in transaction record storage region 236 (block 360). In particular, memory debugger GUI 238 reproduces the contents of memory array 220 at a selected point in time during the simulation by combining the initial data values and transaction records having timestamp values equal to or less than the selected point in time, as described in detail below. In addition, one or more automatic memory test processes are performed by auto test tool 239. In one embodiment, the final memory contents are determined by combining the initial data with all of the transaction records in each file (each file contains the transaction records for a corresponding simulation test), and then compared with known good memory content (block 370). In another embodiment, a sanity check process is performed by comparing data read from memory array 220 with previously-established instantaneous data values (block 380). Each of these tools is described in additional detail below.

Memory Loader

As mentioned above, according to another aspect of the present invention, memory loader 232 pre-loads initial data values into memory cells 226 of memory array 220 before simulated execution of the test program is initiated in order to simplify and shorten each test program simulation. For any hardware simulation of a processor, the memory first has to be loaded with the program and data elements that the processor executes. On an actual processor chip this loading process is performed according to a boot routine that loads the volatile on-chip memory (which loses its data each time the processor is powered down) with the initial data values from an off-chip non-volatile memory device (such as a flash or a read-only-memory (ROM device). Once this boot routine is completed, the processor initiates execution of the "real" program code loaded into the on-chip memory. Loading test data into a simulation model is typically performed in a similar manner. However, simulation of the boot routine takes a significant amount of time in that it requires processing every node of the SOC design (even those not involved in the actual booting process), and is typically not very useful during the debug operation. In fact, for each test program, the first thousand or more simulation cycles would be lost performing the same boot routine, which doesn't increase the test coverage, but wastes a lot of simulation cycles and therefore real runtime of the workstation without providing a corresponding benefit.

Figure 4:
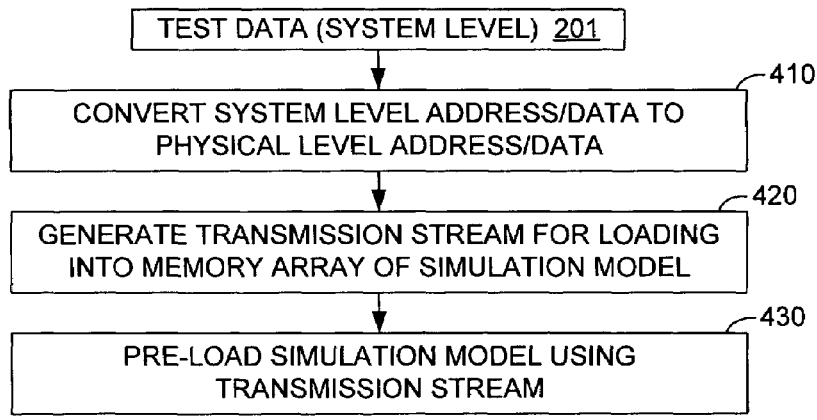
FIG. 4 is a flow diagram illustrating a memory loading phase of the simulation/debugging method of FIG. 3.

As indicated in FIG. 4, according to one embodiment, memory loader 232 includes a special software tool that converts system-level (scrambled) address/data information associated with the test program into physical-level address/data information based on the SOC integrated circuit design (block 410) and specific information regarding memory array 220 provided by test program and data file 201. As complex processor systems map the initial data values into memory array 220, the ordering of the system-level data values may be altered in a possibly tiled, scrambled and interleaved manner. This possible tiling, scrambling, and interleaving is reflected in the converted data and addresses. Next, as indicated in block 420, a transmission stream is generated that includes the physical-level address/data information in a transmittable input file (transmission stream). In one embodiment, the input file is a text (ASCII) based file that utilizes a certain format to express the physical-level address/data information. This file is usually the output of the software tool chain and is produced using a compiler/assembler. In one embodiment, the transmission format is the Intel Hex format, or the Motorola S-record format. Finally, the input file is transmitted into the memory array of the simulation model (block 226). Once this transmission is completed, the simulation is initiated (see block 320 in FIG. 3). Note that the transmission stream generation and data loading description provided above is intended only to functionally describe the actual process, and that the actual generation and loading of data may be performed using many possible methods.

According to one embodiment, the system-level address/data information associated with the test program is stored in a compressed format (e.g., using the Motorola S-record format), with each text line including an identifier string, a byte number value, a system address value, the data values, and a checksum value. The identifier string indicates the location of the text line (e.g., ("S0" identifies the first text line, "S7" identifies the last text line, and "S3" identifies any other text line transmitted between the first and last text line). The byte number value indicates (in hex) the number of bytes in the text line following the byte number value, including the address and checksum values. The system address value is an (e.g., 32-bit) address identifying a first memory byte at which the following data values are sequentially stored. The data values (also in hex) are then sequentially arranged, with the checksum value completing the text line. Accordingly, an exemplary text line in the Motorola S-record format-would be:

S325D40000000001020304050607080 90A0B0C0D0E0F1011-12131415161718191A1B1C1D1E1FCF where "S3" indicates the text line location, "25" indicates that there are 37 (decimal) bytes of address, data, and checksum values, "D400000000" is the 32-bit address associated with the first (least significant) data byte, "01" through "1F" represent the data values, and "CF" is the checksum value. This text line, which describes the system memory content at boot time, is processed line by line in the manner described above such that the system-level data is distributed, scrambled, and/or interleaved according in the required manner, and the resulting physical-level data is written as a transmission stream into memory cells 226 (FIG. 2). In some embodiments, memory loader 232 also performs address calculations such as subtracting a system address offset for a certain physical memory that is selected by this address offset.

Memory Tracer

Referring again to FIG. 2, according to another aspect of the present invention, memory tracer 234 monitors interface circuit 222 of memory array 220 during the simulation of the test program, and generates transaction records that store incremental changes to the data values stored in memory array 220. Similar to the memory loading process (described above), the transaction records are generated using system-level address/data information that is compatible with the initial data values. In one embodiment, memory tracer 234 is coupled to simulation model 205 via a PLI interface, and only writes a new transaction record when corresponding interface signals are active (e.g., a write command, along with corresponding address/data information, is received by interface circuit 222). Note again that memory tracer 234 does not write the complete contents of memory cells 226 each time a transaction occurs (i.e., in the conventional manner used by many EDA tool vendors). Instead, memory tracer 234 writes only the minimal incremental transaction information and timestamp needed to reconstruct the memory content later.

Figure 5:
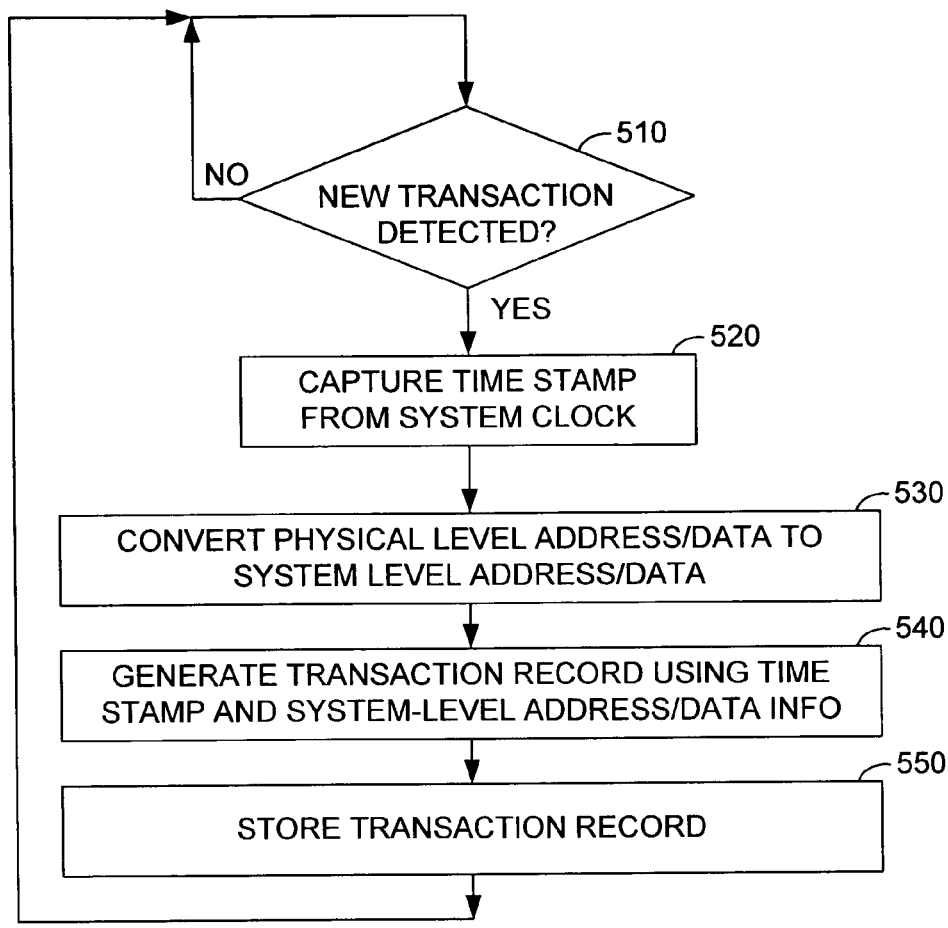
FIG. 5 is a flow diagram illustrating a memory tracing phase of the simulation/debugging method of FIG. 3.
Figure 6:
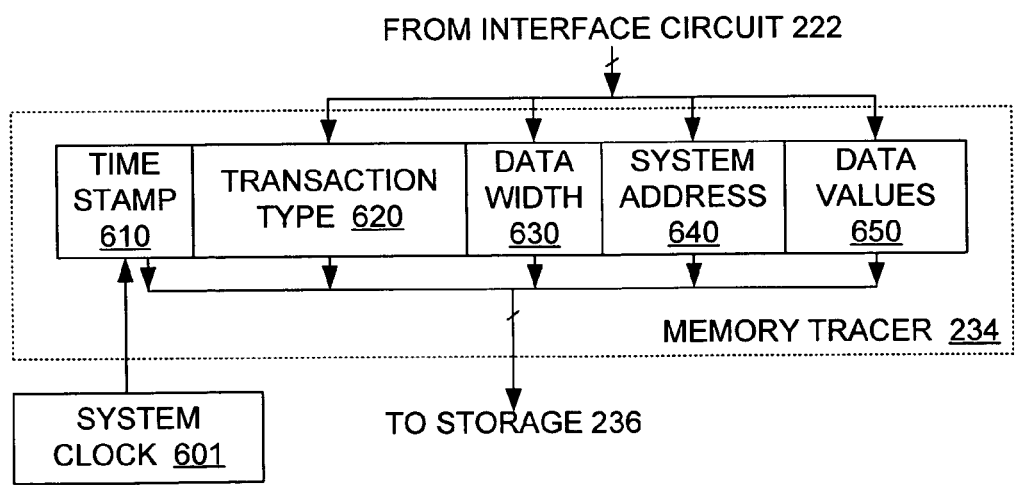
FIG. 6 is a simplified block diagram depicting a memory tracer circuit for generating a transaction record according to an embodiment of the present invention.

FIG. 5 is a flow diagram illustrating the generation of an exemplary transaction record, and FIG. 6 is a simplified block diagram depicting memory tracer 234 including the exemplary transaction record according to an embodiment of the present invention. Upon detecting a new transaction at interface circuit 222 of memory array 220 ("YES" in block 510; FIG. 5), a corresponding timestamp is captured from a system clock 501 (block 520). If necessary, physical-level address/data information associated with the current transaction is converted to a system-level address/data format representing the previously stored initial data information (block 530). This conversion process is similar to that used by memory loader 232 to convert system-level address/data information into physical-level information, only reversed, and some subroutines may be shared by the two processes.

Next, a corresponding transaction record is generated using the system-level address/data information and the timestamp (block 540). To minimize the amount of stored data, each transaction record is stored in a compressed format similar to (but not the same as) the S-record format utilized during memory pre-loading. Referring to FIG. 6, in one embodiment, each transaction record includes timestamp 610, a transaction type value 620, a data width value 630, an address value 640, and one or more data values 650. Transaction type value 620 is an optional field indicating, for example, whether the transaction involves a read operation (discussed below with reference to Sanity Check) or a write operation. More complex transaction type information may be used for cache memories or fifo memories. Data width value 630 is utilized to indicate the number of data bytes involved in the current transaction. Complex processor systems (e.g., TriCore) sometimes support a variety of access/transaction widths and unaligned accesses during load and store transactions to memory. In such systems, when a single address is utilized per transaction record, it is essential to identify and record the width of the accessed data. In one embodiment, this identification process is performed by detecting the number of control lines activated during the transaction. Address value 640 is the system address of the first (lowest numbered) byte accessed during the transaction (after recomputing back from the observed physical addresses considering any tiling, scrambling, unaligned accesses and address offsets back into the system address). Finally, data values 650 are the actual data (in hex) written or read during the transaction, after re-assembling using the tiling and interleaving knowledge, as well as in which tower the access begins. Examples of this tiling and interleaving knowledge are described, for example, in co-owned and co-pending U.S. patent application Ser. No. 10/777,710, entitled "Fast Unaligned Cache Access System and Method", and co-owned and co-pending U.S. patent application Ser. No. 10/777,570 entitled "Fast Unaligned Memory Access System and Method", both being incorporated herein in their entirety. Accordingly, an transaction record generated by memory tracer 234 could be represented as:

110 RD 64 D4000000 0001020304050607 where "110" represents the time value in a predefined time scale (e.g., nanoseconds or picoseconds), "RD" indicates a read operation, "64" indicates that 64 bits were read, "D4000000" indicates the first address associated with the read data, and "0001020304050607" is the data read during this transaction. As described in additional detail below, these transaction records (in combination with the pre-loaded initial memory values) are used for four purposes: first, to reconstruct for graphical display the contents of memory array 220 at any point in time (instant) during the simulated execution of the test program; second to debug the SOC design using the transactions records to assist waveform displays of the hardware simulator; third, to calculate a final memory content "image" at the end of the simulation for comparison with corresponding pre-established "good" memory content; and fourth, to perform integrity ("sanity") checking of read transactions against the instantaneous memory content at each time a read operation occurs. These four purposes are described in additional detail below.

Referring to FIGS. 2 and 5, after generating each transaction record, the transaction record is then stored for subsequent use in memory transaction record storage region 236 of workstation 110 (block 550), and control returns to block 510. As discussed below, these stored transaction records are subsequently used upon completing the simulation process to determine the instantaneous data value at any selected memory location of memory array 220.

As mentioned above, so-called "unaligned" accesses sometimes do not start on a "natural" address boundary (e.g., an integer multiple of the transaction size), but instead start on a fractioned multiple of the transaction size. Additionally, the TriCore system supports any transaction size from 8, 16, 32, 64, 128, 256, or 512 bits, and the start address of any 32 and 64 bit transactions only has to be 16-bit aligned. All other transaction sizes are naturally aligned. So, for example, the following two transaction records are possible in a TriCore system:

100 WR 64 D4000002 0706050403020100
120 RD 32 D4000006 07060504

Having different data sizes and odd alignment makes debugging in these text records extremely difficult (even if the system domain is already used). If, for instance, a user wanted to determine when address byte D4000004 was changed (written) and read during the simulation, then these two transactions records provided above would actually involve this address byte, but a grep for address D4000004 would yield no result (i.e., because the only address values included in the two transaction records are "D4000002" and "D4000006". Under these circumstances, a user would have to search for all possible transaction records having addresses and data widths that could potentially include address D4000004, which would be a very tedious, time consuming, and potentially error prone process.

According to another embodiment of the present invention, when unaligned memory accesses and variable data widths are supported by an SOC design, transaction records are stored such that each data value is stored with its corresponding system (byte) address in order to make grepping of such transaction records is easier to perform. That is, after each transaction record is written to memory, the stored record is expanded to explicitly identify each individual byte transaction. For example, the transaction record having the timestamp "100" (above) is expanded to identify each individual byte as follows:

100 WR 64 D4000002 0706050403020100 [D4000009: 07]
[D4000008: 06] [D4000007: 05] [D4000006: 04]
[D4000005: 03] [D4000004: 02] [D4000003: 01]
[D4000002: 00]

Using this expanded format, a grep for the specific address "D4000004" will yield all transaction records that access memory cell D4000004 without regard to the particular data width and alignment of the transaction records.

In addition to the information fields associated with the transaction records described above, additional information can be included in each transaction record to facilitate the debugging process. For example, in one embodiment the Program Counter value of the program instruction that caused a particular transaction may be included in the transaction record. In another embodiment, the source (e.g., the CPU or DMA) of a read or write operation is identified in the transaction record (i.e., in systems where more than one master accesses the same memory device using the same kind of transactions). Further, when the memory device involved is a cache memory, additional information like tag updates, index numbers, or the way selected can also be included in the transaction record to compute the content not just of the cache data array, but also the tag array. In addition, information related to the operation of fifo memory devices can be included in the transaction record to enable the reconstruction of the fifo content at any point in time in simulation process without having to store the entire memory contents each fifo transaction. For example, according to one embodiment, transaction records may indicate a "push write" fifo operation or a "pop" fifo operation that are used to calculate changes to the fifo content during a simulation test. That is, if the entire contents of the fifo before execution of each fifo operation (e.g., "push write" or "pop") are known, then the contents of the fifo after execution of a particular fifo operation can be determined (calculated) by knowing the effect of that fifo operation on the fifo contents. Accordingly, instead of dumping the entire content of the fifo each time these operations occur during a simulation test (which requires a significant amount of time and storage), the present invention provides an efficient method of recording and analyzing fifo memory contents by generating a transaction record for each fifo operation during a simulation test, and then calculating the instantaneous fifo contents at a selected point in time using the initial data and all sequential fifo operations executed before the selected point in time. These additional information fields, as well as others that would be apparent to those skilled in the processor art, may be beneficially included in the transaction records to crosslink the memory debug process to the rest of the SOC design and to the test program.

Memory Debugger GUI

Referring again to FIGS. 2 and 3, as mentioned above, at the end of the simulation process (i.e., after completing the simulated execution of the test program; see block 350 in FIG. 3), memory debugger GUI 238 combines one or more transaction records from memory transaction record storage region 236 with the initial data values passed from memory loader 232 (or, for example, test program/data file 201) to determine instantaneous data values stored at selected memory locations of each logical (or system) memory array during the simulation process. In one embodiment, an instantaneous data value stored at a memory location D0 at a selected time t3 is determined by identifying all transaction records having timestamp values between a simulation start time t0 and selected time t3 that include updated data values associated with memory location D0, and then modifying the instantaneous data value using the last (most-recent) transaction record (i.e., having the highest timestamp value that is less than or equal to the selected time t3). For example, if memory location D0 stores an initial data value 00 (hex) at time t0, is updated to store a value 01 at a time t1, and is updated to store a value 02 at a time t2, and is updated to store a value 04 at time t4 (times t1 and t2 sequentially occurring between start time t0 and selected time t3, and time t4 occurring after time t3), then the instantaneous data value of location D0 at selected time t3 is determined by the updated data value occurring at time t2. In a similar manner, the memory contents of memory location D0 can be chronologically analyzed using the updated values occurring at times t1, t2 and t4.

According to another aspect of the present invention, memory debugger GUI 238 generates a graphical representation on output/display device 118 that displays the instantaneous data values stored in the memory array, and in parallel shows the transaction stream leading up to the instantaneous memory content (i.e., one or more transaction records associated with the displayed instantaneous data values). An exemplary graphical representation is shown in FIG. 7, which is a simulated "screen shot" including a memory content field 710 and a transaction record field 720. With this graphical representation, when a user selects a simulation time, the last transaction record in the transaction stream that was generated before the selected simulation time is displayed, and simultaneously the user will see the memory content of the complete logical array being updated to the content at this specific simulation time. For example, as indicated in FIG. 7, when a user selects a time "Time=25000", the memory content at that time is displayed in memory content field 710, and chronologically arranged transaction records having timestamp values preceeding timestamp 25000 are displayed in transaction record field 720. In addition, by selecting transaction record 725 (which occurs at time 25000), the memory content region 715, which is identified in transaction record 725, is changed from a preceeding state to include the updated values, and then the time would "jump" to exactly the timestamp of the last update, and the content window would show exactly the content of ALL memory cells at the point in time, when this last transaction happened. Similarly, the user can search forward and backward for a transaction involving a certain memory address, or a certain program counter (when this information is included in the transaction records, and both the transaction stream and the memory content are re-computed and updated to the simulation time at which such a transaction happened. In addition, a user may "select" one memory cell in the content window and then scroll through all transactions changing the value stored by this memory cell both forward and backward, thereby viewing the transaction stream and the complete memory content over time to the point when this update occurred. Accordingly, memory debugger GUI 238 provides a very powerful high-level debugging tool that allows a user to quickly correlate memory content and program flow to debug both the SOC design and the simulated test program.

Automatic Memory Tests

As discussed above, in addition to providing the debugger/GUI function, the debugging tool also performs automatic tests (checks) of the memory content in order to identify the presence of hardware bugs (design flaws) in the corresponding SOC design that may otherwise not be discovered using the graphical debugging method described above.

Memory Image Writer (Memory Dump)

Figure 8:
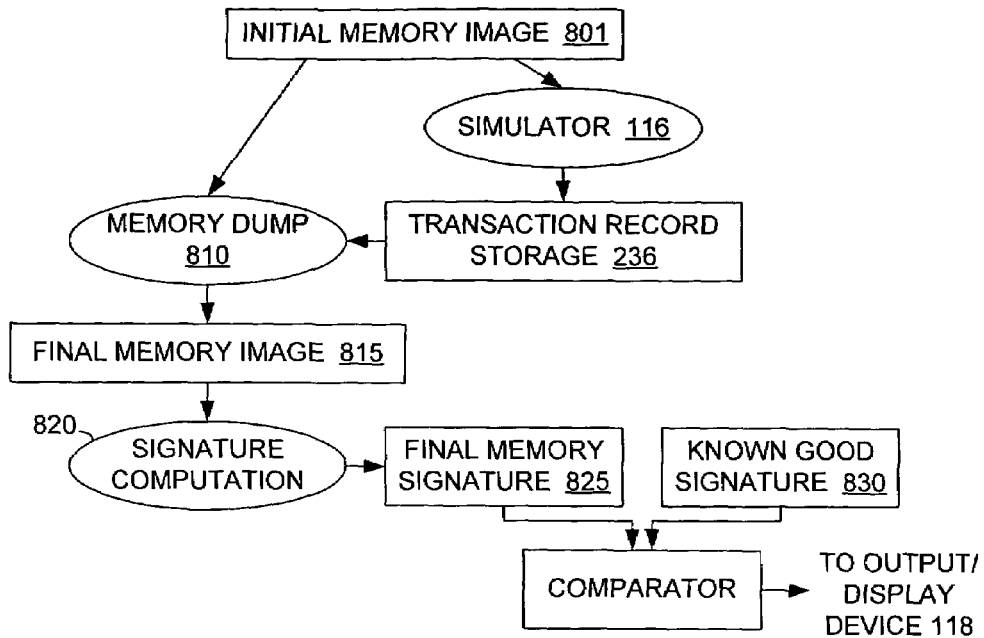
FIG. 8 is a flow diagram illustrating a memory imaging (memory dump) phase of the simulation/debugging method of FIG. 3.

FIG. 8 is a flow diagram showing a memory-dump test automatically performed in accordance with an embodiment of the present invention. The purpose of the memory-dump test is to verify that the final contents of memory array 220 are correct. Similar to the debugger GUI processing discussed above, the memory-dump test utilizes an initial memory image 801 (i.e., the system-level initial data values processed) and simulator 116 to produce transaction records that are stored in transaction record storage region 236.

The initial memory image 801 and all transaction records from transaction record storage region 236 are then processed by a memory dump tool 810 to produce a final memory image 815 (i.e., a copy of the contents of memory array 220 at the end of the simulated test program, as calculated by modifying the initial data values with each associated update reflected in all of the transaction records). In one embodiment, final memory image 815 is generated using the S-record format (discussed above). The S-record format provides an advantage in that it only specifies cells that were ever either pre-loaded or written (i.e., any undefined cell in memory array 220 may be omitted using this format). This is very important for comparison with a software simulator because many simulators treat undefined cells in different manners. Hardware simulators utilize the value "X" (i.e., "undefined") in addition to logic values "0" and "1", but software simulators many times assume all cells store a "0" value at simulation time, so that these cell values will be read at the end of the simulation even if the cell has not been defined.

In one embodiment, the final memory image 815 is compared with a known good image (not shown) to detect errors generated during the simulation. However, final memory image 815 can be considerable bigger than initial memory image 801 (up to the total size of memory array 220 plus some S-record overhead). Therefore, storing and comparing final memory image 815 and a known good image would require a significant amount of disk space (typically, there are several thousand test program directories in the regression suite).

To avoid the potential disk space capacity issues associated with storing and comparing S-record images, as indicated in FIG. 8, a signature computation tool 820 is utilized to generate a final memory signature 825, which identifies the contents of final memory image 815 in a highly compressed manner (i.e., a few bytes). Final memory signature 825 is then compared with a known good signature 830, and the user is notified of any differences between these signatures. In one embodiment, if differences are detected, then the good and bad memory images are reconstructed using resimulation, and then displayed for line-by-line comparison. Final memory signature 825 and known good signature 830 are computed using a polynom algorithm according to known techniques. Briefly described, the polynom algorithm computes a present value using a previously calculated signature value and a next sequential data value form the final memory image. Ideally, a polynom algorithm is utilized that produces a different signature for each minor data value deviation, thereby allowing recognition of differences between final memory image 815 and the known good memory image represented by known good signature 830.

The ability to compare the memory content at the end of the hardware simulation against the known good memory content of a golden architectural model is very important. It is entirely possible that a hardware bug leads to a situation where a single data value is erroneously written to two memory cells, and this error normally not easily be identified (even if the values are written in a self-checking manner) by conventional methods that usually only test the cell that was supposed to be written. Most test programs will not perform a negative check to check all other cells that were supposed NOT to be written (that would also be very time consuming too). The memory dump comparison of the final memory image enables a very simple method of checking for such unwanted write operations throughout the memory in a very quick manner (and it can additionally be done after the simulation so that there is no impact on simulation time).

Sanity Check

Figure 9:
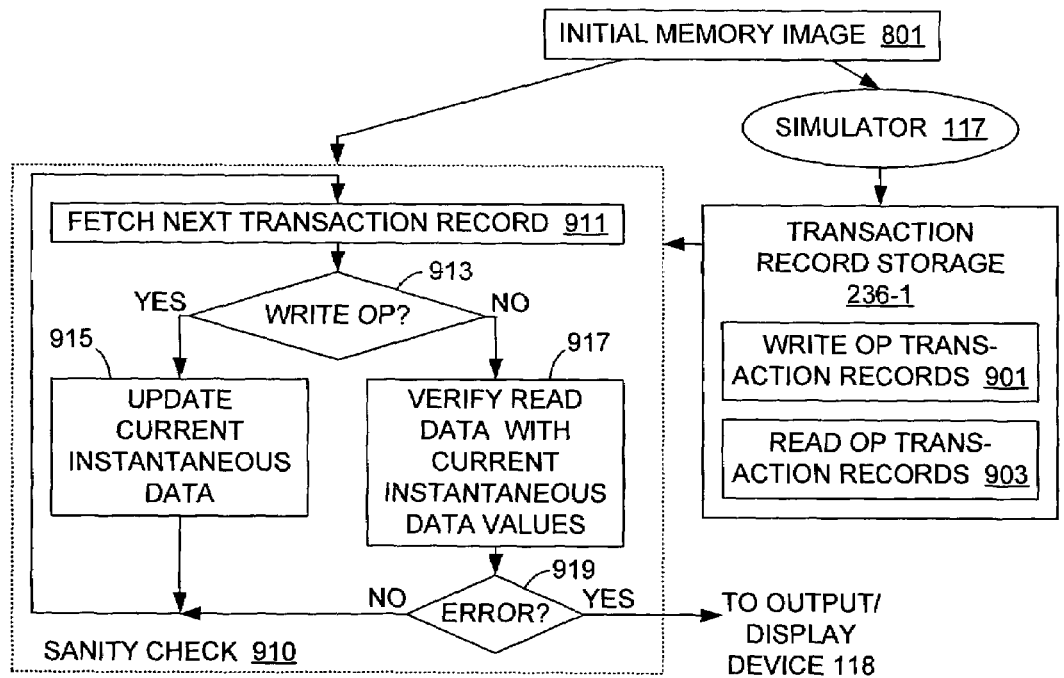
FIG. 9 is a flow diagram illustrating a sanity check phase of the simulation/debugging method of FIG. 3.

FIG. 9 is a flow diagram showing a second automatic memory test software tool 910, referred to herein as a "sanity check" tool, which is performed in accordance with another embodiment of the present invention. The purpose of sanity check tool 910 is to verify the accuracy of the data stored in the memory during the simulation.

As indicated in FIG. 9, similar to the memory dump process (discussed above), the sanity check process is performed using initial memory file 801 and transaction records generated by simulator 116. However, in addition to write operation transaction records 901 that are generated as described above, a modified transaction record storage region 236-1 also includes read operation (second) transaction records 903 that are generated in response to read operations from memory array 220 (FIG. 2) that are performed during the simulation. Referring briefly to FIG. 7, read operation transaction records (e.g., transaction record 729) are similar to write operation transaction records in that they include an associated timestamp, associated address information, and the data values read (accessed) during the associated read operation. According to the present embodiment, the read transaction records associated with reads from a logical memory are generated in a manner similar to that described above, and are combined together with the write transaction records associated with writes to the logical memory to form a transaction file (i.e., the transaction file contains all transaction records, read from and/or write to the associated logical memory, that take place during an associated simulation test.

Referring to the left side of FIG. 9, the sanity check process begins when the simulation of a test program is completed. Similar to previous processing techniques, sanity check tool 910 sequentially processes transaction records from transaction record storage memory 236-1 (block 911) beginning with the lowest timestamp value and ending with the highest timestamp value. If the next sequential transaction record represents a write operation (YES in block 913), then the transaction record is processed as described above to update the instantaneous data values stored in memory array 220 at that simulation time (block 915). However, if the next sequential transaction record represents a read operation (NO in block 913), then the data value(s) included in the read operation transaction record are verified by comparing the read data value(s) with corresponding instantaneous data value(s) (block 917). For example, utilizing a modified version of the example described above, assume memory location D0 stores initial data value 00 (hex) at time t0, is updated to value 01 at time t1, is again updated to value 02 at time t2, is read at time t3, and is then again updated to value 04 at time t4, and is then read at a time t5. During the verification process, the value read at time t3 is compared with the instantaneous data value for location D0 at time t3 (i.e., value 02 as updated at time t2). If an error (i.e., a mismatch between the read data value and the instantaneous data value) is detected, then a warning flag is generated and written into a log file (YES in block 919) that allows a user to quickly find the mistake at the source rather than through the error's effects. This process is performed for all transaction files automatically (so basically for all test programs of the regression suite, and in each such test program for all logical memories that have written an individual transaction file).

Accordingly, sanity check tool 910 sequentially processes all transaction records and constantly updates the memory content with each write operation, and verifies each read operation by comparing with the instantaneous (reconstructed) memory content. Theoretically, one would think there should never be a problem. However, as the memory systems of modern SOC devices are fairly complex and, for example, also utilize write fifo's, it can very easily happen that the memory device has a bug that causes incorrect write operations, or incorrect read operations (e.g., the forwarding of data from a write fifo when a hit there doesn't really happen). Should any read transaction have data in the transaction record that does not match the instantaneous data values, an error is flagged for debugging purposes. In addition, sanity check tool 910 can be used to exclude memory devices as sources of problems, which can be very valuable by preventing unnecessarily wasted debugging time in complex SOC designs.

In addition, sanity check tool 910 can be used to flag any access to an uninitialized memory cell (or a partial access to such uninitialized memory cells), which in the actual (fabricated) SOC device hardware would result in an "X" (unknown) value. Normally, a test program reading from uninitialized memory cells have a problem in that, sooner or later, this "X" value can lead to a severe (real or false) problem in the SOC device. The software simulator doesn't really recognize such problems as it pre-assumes all memory cells with fixed "0" values. So the test program may pass the instruction set simulator and while applied to the hardware causes a fatal problem involving "X" propagation (like comparing two data values loaded from the same memory cell containing "X" values, which is acceptable in software and silicon, but in hardware simulation would result in an "X" as well; another source of the "X" value problem is reading from an uninitialized memory cell). Such "X" value propagations are very hard to find and track to the source because the "X" value quickly propagates throughout the whole processor, especially if it starts influencing control signals like a "branch taken" signal. Sanity check tool 910 circumvents this problem by providing a warning flag for the person writing the test program, and to the person debugging the SOC design. This warning flag also helps to rule out such cases if the transaction record is clean. This warning allows the detection of both software and "real" hardware bugs much earlier in the design/development process, thereby reducing the overall cost of the final SOC device and potentially preventing catastrophic cost overruns.

Similarly, sanity check tool 910 facilitates the detection of fifo overflow or underflow events and the identification of other test program bugs. Data is typically written to fifo devices using "push" or "push write" operations, and is read (removed) from the fifo device using "pop" operations. Data overrun events occur when too much data is "pushed" written into the fifo device (i.e., an instantaneous number of data values stored in the fifo device exceeds a maximum allowable number), thereby causing the unintended over-writing of valid data. Data underflow events occur when a "pop" operation is executed after the fifo stack is empty of valid data (i.e., when the instantaneous number of data values stored in the fifo device equals zero, and then a pop operation is executed). Sanity check tool 910 circumvents this problem by determining the number of instantaneous data values stored in the fifo at each transaction (i.e., each selected point in time), in addition to calculating changes to the fifo stack in response to each "push" or "pop" operation, and by providing a warning flag to the person debugging the SOC design when a overflow or underflow event is detected (e.g., when the number of instantaneous data values stored exceeds the fifo stack capacity, or upon detecting a "pop" operation from an empty fifo stack). In a similar manner, sanity check tool 910 can be used to identify other test program bugs that are otherwise missed or difficult to identify using conventional tools, thereby reducing the overall cost of the final SOC device and potentially preventing catastrophic cost overruns.

Cache Viewer, Cache Transaction Records, and Cache Sanity Check

In addition to simulating, debugging, and automatically testing "normal" (e.g., SRAM and DRAM) and fifo memory devices, the present invention may also be utilized to debug cache memory devices. In the case of cache memories, the data and tags are normally stored in separate memory arrays, and the valid, dirty and age bits may reside in synthesizable DFFs. Therefore, using conventional techniques, the contents of a cache memory can only be displayed using separate display regions depicting the data values, tag arrays and the special bits associated with each cache entry. For the person debugging the cache memory, this conventional technique can turn out even much tougher than the already complicated tiling of "simple" memories, as all the other complexities (like write fifo's, scrambling, tiling, interleaving, address offsets subtraction, etc.) also apply in caches, in addition to the inherent higher complexity of cache systems. Further, in a cache there are usually many ways interleaved into one row in the tag (as they have to be accessed together anyway for any access to select which way has the hit). The same interleaving utilized in "normal" memories is also utilized for storing the data portion of the cache memory. And many times in a cache one tag row is responsible for representing multiple physical data rows making the alignment between them even harder. Therefore, the system address needs to be computed not only taking into account all tiling, scrambling, and offset of the stored data, but also the content of the tag entry.

As with "normal" and fifo memories, an SOC designer is typically not interested in the physical contents of a cache memory, but rather the system-level view. In the end, all the user is interested in is which system addresses are currently present in the cache, and what data the cache contains. Indeed, cache lines/ways that are marked as invalid don't even have to be displayed, as they are completely uninteresting to the user. Therefore, similar to the "normal" and fifo memory display/debugging methods described above, cache memory contents are processed and displayed using a system perspective.

According to another aspect of the present invention, the system address for cache memories is calculated from the index and the tag address portion, which is stored for each way in the tag array of each cache memory of each index, which further contributes to the much higher debug complexity. As the cache doesn't necessarily contain consecutive addresses, the graphical display of the debugger GUI sorts the system addresses and skips any invalid lines. For each system address, the GUI displays for the user the way and index in which the corresponding data value(s) are stored, and the actual data value(s) contained therein. In addition, the display can also show the more physically oriented view (which in the cache case is important for debugging certain implementation details as well), where one can switch the viewer to be able to sort according to cache index and/or ways, and show the system addresses contained in each index/way, and if the elements are valid at all. In this manner, the GUI graphically displays cache memory features that are similar to those described above for normal and fifo memories. However, the cache memory transaction records needs to contain a bit more information about the way and index in which the cached memory is stored, and information about updates of the associated valid, dirty and age bits.

In addition to processing and debugging, the sanity check tool described above) may also be utilized to verify the contents of cache memories. Actually, in cache memories, the sanity check tool is modified to verify that a memory element was correctly written back (should it have been displaced from the cache), and correctly refilled on a subsequent read. This verification process presents a special problem because the cached data elements may be modified by other masters that also access the same cache memory after the writeback, thereby potentially causing the sanity check tool to generate a false fail flag after the next refill and read access (i.e., if the refill data is not taken into account as a "write" transaction, as done here). According to another aspect of the present invention, this special problem is addressed by treating the writeback operation as a read from the cache (and also tracking the writeback operation in a corresponding transaction record), and then treating the refill operation like a write to the cache (and also tracking it in a corresponding transaction record). In this manner, the sanity check tool is able to successfully verify the cache memory contents, even if the contents of the cache memory are changed in the interim by another master, as long as the data resides outside the cache. As these refills and writebacks are uniquely identified, the sanity check tool can also skip over them, and thus perform the sanity check even in cases involving bus transactions to the underlying memory (if there is no other master modifying the memory elements that are cached). Accordingly, the method can flexibly adapt to the special situation around caches while maintaining its full power or even increasing its power.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A method for debugging a system-on-chip (SOC) integrated circuit design including a processor core and a memory array for storing data generated by the processor core, the SOC integrated circuit design being represented by a simulation model, the method comprising:
    loading initial data values into the memory array associated with the simulation model and simulating the execution of a predefined test program using the initial data values;
    during the simulated execution, generating a plurality of transaction records identifying write operations during which updated data values are written into the memory array, wherein each transaction record includes an associated timestamp, associated address information, and the updated data values written during the associated write operation; and
    upon completing the simulated execution, determining instantaneous data values stored in the memory array at a selected point in time during the simulated execution by combining the initial data values and updated data values from one or more transaction records.

2. The method according to claim 1, wherein loading the initial data values comprises:
    converting system-level address/data information to physical-level address/data information based on the SOC integrated circuit design;
    generating a transmission stream including the physical-level address/data information; and
    writing the transmission stream into the memory array of the simulation model.

3. The method according to claim 2, wherein writing the transmission stream occurs before simulating the execution of the predefined test program.

4. The method according to claim 1, wherein generating a plurality of transaction records comprises monitoring an interface circuit of the memory array, and generating said each transaction record when said associated address information and said updated data values are detected in the interface circuit.

5. The method according to claim 4, wherein generating said each transaction record comprises capturing a timestamp from a system clock upon detecting said associated address information and said updated data values in the interface circuit.

6. The method according to claim 4, wherein generating said each transaction record comprises converting said associated address information from a physical-level format to a system-level format.

7. The method according to claim 4, wherein generating said each transaction record comprises capturing at least one of an access width and an access type associated with the updated data values.

8. The method according to claim 4, further comprising storing said transaction record in an expanded format that identifies each byte location of the memory array that is accessed during said associated write operation.

9. The method according to claim 4, wherein each transaction record further comprises at least one of a transaction source identifier and a program counter value.

10. The method according to claim 1,
    wherein the SOC integrated circuit design includes a first-in first-out (fifo) memory device for storing a plurality of fifo data values,
    wherein generating the plurality of transaction records includes generating a first transaction record identifying a push write operation occurring at a first point in time during which a first fifo data value is written into the fifo memory device, and
    wherein determining instantaneous data values stored in the fifo memory device at the first selected point in time includes identifying the push write operation from the first transaction record, and calculating changes to each of the plurality of fifo data values in response to writing the first fifo data value into the fifo memory device.

11. The method according to claim 10, further comprising detecting an overflow condition of the fifo memory device by determining an instantaneous number of data values stored in the fifo memory device at the first selected point in time, and comparing the instantaneous number with a predetermined maximum number.

12. The method according to claim 1,
    wherein the SOC integrated circuit design includes a first-in first-out (fifo) memory device for storing a plurality of fifo data values,
    wherein generating the plurality of transaction records includes generating a first transaction record identifying a pop operation occurring at a first point in time during which a first fifo data value is read from the fifo memory device, and
    wherein determining instantaneous data values stored in the fifo memory device at the first selected point in time includes identifying the pop operation from the first transaction record, and calculating changes to each of the plurality of fifo data values in response to reading the first fifo data value from the fifo memory device.

13. The method according to claim 12, further comprising detecting an underflow condition of the fifo memory device by determining an instantaneous number of data values stored in the fifo memory device, and detecting execution of the pop operation when the instantaneous number is zero.

14. The method according to claim 1, wherein determining an instantaneous data value stored at a selected memory location of the memory array at the selected time comprises identifying a group of transaction records having timestamp values between a start time of the simulated execution and said selected time and that include updated data values written into the selected memory location, and modifying the instantaneous data value using a most-recent transaction record from the group of transaction records having the highest timestamp value.

15. The method according to claim 1, further comprising generating a graphical display on an output device that simultaneously displays both the instantaneous data values stored in the memory array, and at least one of said transaction records.

16. The method according to claim 1, further comprising:
    combining the initial data values with said updated data values from all of said transaction records to generate a final memory image; and
    comparing the final memory image with a known good memory image and flagging differences.

17. The method according to claim 1, further comprising:
    combining the initial data values with said updated data values from all of said transaction records to generate a final memory image;
    converting the final memory image into a final memory signature value; and
    comparing the final memory signature with a known good signature.

18. The method according to claim 1, further comprising:
generating a plurality of second transaction records identifying read operations during which selected second data values are read from the memory array, wherein each transaction record includes an associated timestamp, associated address information, and the selected second data values accessed during the associated read operation; and
verifying the selected second data values for each associated address by comparing the selected second data values with the instantaneous data values previously determined for the associated address.

19. The method according to claim 18, further comprising detecting access to an uninitiated memory cell, and generating an associated warning flag.

20. The method according to claim 1,
wherein the memory array comprises cache memory for storing a plurality of cache data values, the cache memory including a tag array, wherein generating the plurality of transaction records includes generating a first transaction record identifying a cache write operation occurring at a first point in time during which a first cache data value is written into the cache memory and a corresponding change is generated in the tag array, where the first transaction record includes a tag field identifying the change to the tag array, and
wherein determining instantaneous data values stored in the cache memory at the first selected point in time includes identifying the cache write operation from the first transaction record, and calculating the change to the tag array based on information stored in the tag field of the first transaction record.

21. The method according to claim 1, wherein the updated data values contain only incremental data changes associated with the one or more transaction records.

22. A computer-usable medium storing computer-executable instructions which when executed perform a process of simulating and analyzing a system-on-chip (SOC) integrated circuit design, the SOC integrated circuit design including a processor core and a memory array for storing data generated by the processor core, the SOC integrated circuit design being represented by a simulation model, the process comprising:
loading initial data values into the memory array associated with the simulation model and simulating the execution of a predefined test program using the initial data values;
during the simulated execution, generating a plurality of transaction records identifying write operations during which updated data values are written into the memory array, wherein each transaction record includes an associated timestamp, associated address information, and the updated data values written during the associated write operation; and
determining instantaneous data values stored in the memory array at a selected time during the simulation process by combining the initial data values and updated data values from one or more transaction records.

23. The computer-usable medium according to claim 22, wherein loading the initial data values comprises:
converting system-level address/data information to physical-level address/data information based on the SOC integrated circuit design;
generating a transmission stream including the physical-level address/data information; and
writing the transmission stream into the memory array of the simulation model.

24. The computer-usable medium according to claim 22, wherein the process further comprises:
generating a plurality of second transaction records identifying read operations during which selected second data values are read from the memory array, wherein each transaction record includes an associated timestamp, associated address information, and the selected second data values accessed during the associated read operation; and
verifying the selected second data values for each associated address by comparing the selected second data values with the instantaneous data values previously determined for the associated address.

25. The computer-usable medium according to claim 22, wherein the updated data values contain only incremental data changes associated with the one or more transaction records.

26. A system for debugging a system-on-chip (SOC) integrated circuit design including a processor core and a memory array configured to store data generated by the processor core, the system including storage configured to store a simulation model representative of the SOC integrated circuit design, the simulation model including a processor core and a memory array configured to store data generated by the processor core, the system also including and unit configured to perform a debugging process comprising:
loading initial data values into the memory array associated with the simulation model and simulating the execution of a predefined test program using the initial data values;
during the simulated execution, generating a plurality of transaction records identifying write operations during which updated data values are written into the memory array, wherein each transaction record includes an associated timestamp, associated address information, and the updated data values written during the associated write operation; and
determining instantaneous data values stored in the memory array at a selected time during the simulation process by combining the initial data values and updated data values from one or more transaction records.

27. The system according to claim 26, wherein loading the initial data values comprises:
converting system-level address/data information to physical-level address/data information based on the SOC integrated circuit design;
generating a transmission stream including the physical-level address/data information; and
writing the transmission stream into the memory array of the simulation model.

28. The system according to claim 26, wherein the updated data values contain only incremental data changes associated with the one or more transaction records.

* * * * *

UNITED STATES PATENT AND TRADEMARK OFFICE
CERTIFICATE OF CORRECTION

| | |
|---|---|
| PATENT NO. | : 7,437,692 B2 |
| APPLICATION NO. | : 10/705101 |
| DATED | : October 14, 2008 |
| INVENTOR(S) | : Klaus J. Oberlaender |

It is certified that error appears in the above-identified patent and that said Letters Patent is hereby corrected as shown below:

In the Specification:

On the Title page, section (57), Abstract, line 3, delete "incremetal," and insert -- incremental --, therefor;

col. 3, line 8, delete "incremetal," and insert -- incremental --, therefor;

col. 3, line 21, delete "incremetal," and insert -- incremental --, therefor;

col. 3, line 23, delete "occured," and insert -- occurred, --, therefor;

col. 3, line 27, delete "diskspace" and insert -- disk space --, therefor;

col. 6, line 23, delete "incremetal," and insert -- incremental --, therefor;

col. 6, line 37, delete "incremetal," and insert -- incremental --, therefor;

col. 6, line 41, delete "occured," and insert -- occurred, --, therefor;

col. 7, line 14, delete "(ROM" and insert -- (ROM) --, therefor;

col. 9, line 29, delete "an" and insert -- a --, therefor; and col. 16, line 40, delete "above)" and insert -- above --, therefor.

UNITED STATES PATENT AND TRADEMARK OFFICE
CERTIFICATE OF CORRECTION

PATENT NO. : 7,437,692 B2
APPLICATION NO. : 10/705101
DATED : October 14, 2008
INVENTOR(S) : Klaus J. Oberlaender It is certified that error appears in the above-identified patent and that said Letters Patent is hereby corrected as shown below:

In the Claims:

Claim 26, col. 20, line 29, delete "and" and insert -- a --, therefor.

Signed and Sealed this

Third Day of March, 2009

JOHN DOLL
*Acting Director of the United States Patent and Trademark Office*